United States Patent [19]

Shah

[11] Patent Number: 5,065,081
[45] Date of Patent: Nov. 12, 1991

[54] ZERO ERROR DIGITAL SERVO SYSTEM

[76] Inventor: Emanuel E. Shah, 1221 Trinity Dr., Benbrook, Tex. 76126

[21] Appl. No.: 435,043

[22] Filed: Nov. 13, 1989

Related U.S. Application Data

[63] Continuation-in-part of Ser. No. 130,958, Dec. 10, 1987, abandoned.

[51] Int. Cl.$^5$ ............................................... G05B 1/06
[52] U.S. Cl. ................................... 318/638; 318/652; 318/480
[58] Field of Search ............... 318/138, 254, 480, 600, 318/601, 603, 638, 652

[56] References Cited

U.S. PATENT DOCUMENTS

| | | | |
|---|---|---|---|
| 2,968,756 | 1/1961 | Devol | 318/480 X |
| 3,324,369 | 6/1967 | Markakis | 318/138 |
| 3,358,202 | 12/1967 | Pabst et al. | 318/480 X |
| 3,795,852 | 3/1974 | Favard | 318/480 X |
| 4,511,797 | 4/1985 | Pohlig et al. | 318/480 X |
| 4,736,140 | 4/1988 | Ernst | 318/480 X |

Primary Examiner—Bentsu Ro

[57] ABSTRACT

A zero error digital servo system where positioning is achieved by minimizing the positioning error value to zero. Stable logic states of sensors is used to achieve positioning instead of zero crossing of the error signal value. The magnitude of positioning error is reduced to a zero value by unique design of the digital encoder and positioning of the sensors. Stable logic states of the sensors indicates true position of the encoder with reference to the encoder sensors. Any deviation of the encoder from the true position is immediately detected by change in the logic states of the sensors. The technique can be used for both rotary as well as linear encoders.

11 Claims, 5 Drawing Sheets

CLOCKWISE

FIG. 4

ANTICLOCKWISE

ZERO ERROR DIGITAL SERVO SYSTEM

This application is a continuation-in-part of prior pending application Ser. No. 07/130,958 filed Dec. 10, 1987 of Emanuel E. Shah for Zero error digital servo system, now abandoned.

FIELD OF THE INVENTION

The present invention relates to a zero error digital positioning system employed in servo systems for motion control applications. This positioning system provides higher positioning accuracy at lower cost not obtained with the prior art positioning systems.

BACKGROUND OF THE INVENTION

The application of digital positioning systems in the motion control servo systems of the machine tool and automatic equipment industry is a demonstrated success. Over the years, however, many new areas of technology have developed at a very rapid pace such as robotics, IC manufacturing, and advanced instrumentation, which requires advanced positioning systems with critical performance parameters not obtained with the prior art positioning servo systems. Some critical performance characteristics such as positioning accuracy, accurate velocity and acceleration control and system response time determines the suitability of any positioning system to a given servo application.

In spite of the increasing demand for better performing servo systems with superior performance characteristics, the basic digital positioning systems have not improved for a long period of time.

The basic approach taken to solve a digital positioning problem in the prior art systems is described in Automotive Components Handbook published by Intel Corp. (1987) pages 11-7 to 11-11 inclusive. This approach represents the state of the prior art relating to the digital positioning systems. As described in this Handbook, a rotating chopper disc controlled by a DC motor is positioned by digital control means at a selected position or count by the digital sensors activated by two light sources. As described in the approach, the disc has six position markers of counts where the disc can be positioned. It has two zones or phases of markers for each count or position the chopper disc can be positioned at.

In the above example the outer track is defined as phase B and the inner track is defined as phase A. Those skilled in the art will recognize the use of quadrature output which provides information on both direction and speed of rotation of the chopper disc. The logic state of the sensor detecting the position of the counts on phase B is in quadrature phase relation to that of the sensor detecting the position of the count on phase A. The waveforms generated by the sensors for both clockwise and anticlockwise rotation are shown in the Intel Handbook.

The positioning of the chopper disc at any of the six given counts is achieved by zero crossing of the error signal. The zero error occurs at the edge transition of the logic state defining the position of the selected count or marker. It is therefore defined as lock on edge type positioning system.

Let us assume that the disc is rotating in a clockwise direction and the output logic state of the sensor is true or '1' when the sensor is covered by the count preventing the light source from activating the sensor. And, the logic state is false or "0" when the sensor is not covered by the count allowing the light to activate the sensor.

The positioning at any count is achieved when the sensor detecting the position of the counts on phase A remains at logic '1' state and sensor detecting the position of the counts on phase B changes logic state from logic "0" to "1". This occurs at the edge of the transition of logic state waveform. Or, when the error signal reaches zero value and changes sign at the edge of the signal waveform.

An ideal situation would occur if the encoder disc will be able to attain a stable position at zero value of the error signal just before the error signal changes the sign. Those skilled in the art will recognize the fact that in actual practice, however, due to finite inertia of the disc and also due to finite time delay from sensor signal to motor movement, actual and absolute positioning of the disc at the edge is not possible. The disc will rotate past the edge, which will be detected by the control logic and the direction of rotation will be reversed to lock the encoder disc at edge from "0" to "1". A constant repetitive movement in foreword and reverse direction as close to the edge as can be made possible by given system parameters will be the final position achievable with this type of positioning system. Those skilled in the art will immediately recognize the limitations and disadvantages of this system.

First, the system never stops oscillating about the final count to reach a steady logic state, and in addition, the error will vary with the change in load inertia which implies that the positioning accuracy will change with the change in the load inertia. These factors will constrain the error to never approaches to a "0" value. Secondly, regardless of how good a system is designed or critical parameter chosen, there will always exist a window of finite error around which the system stability will dwell. This will prevent an absolute positioning to be achieved. In some applications not requiring critical accuracy, that does not create any problems. And, in some applications, the system can be designed around these limitations with limited success. In high precision systems, requiring critical performance parameters, however, these limitations are not acceptable. But, in absence of availability of any suitable alternate systems in the prior art, the older systems, although not perfect and providing inferior performance, are still being used with accompanying limitations and disadvantages.

Another problem, as yet not recognized, nevertheless very important, is a need for two tracks of counts in prior art systems. This will force the disc, for a given circumference to accommodate specific number of elements to give a selected resolution on the encoder disc. Thus, for any given count, a circumferential length has to accommodate two elements or graduations defining only one position. This adds to the size, weight, and cost of the system. Another problem experienced with the prior art systems relates to the number of counts required per disc to achieve the required positioning accuracy regardless of the resolution to which measurements are necessary. The final positioning in a lock on edge type system is maintained by oscillating the disc about any given count so that larger the number of count, the smaller the oscillation of the disc and higher the positioning accuracy. As an example, for a disc having 10 counts per revolution, the resolution will be 36 deg. per count. However, the disc can not be allowed to oscillate 36 deg. because the positioning will then be very inaccurate. Therefore, to achieve higher accuracy, a very large number of counts are required. This again adds to the size, weight, and cost of the system.

As an additional approach to further improve the positioning accuracy, the article further goes on to describe a need for an additional analog circuit, employing additional components to achieve finer, more accurate positioning. There is however, a significant additional cost involved and all analog systems are subject to temperature and voltage drifts which adversely affects the final accuracy. An additional approach suggests using triangular waveform instead of using square waveforms. This approach provides better accuracy, however, still the error does not tend to approach a zero value.

In view of the problems and disadvantages of the prior art positioning systems discussed in the foregoing, it will indeed be desirable to have a positioning system which will overcome the problems, limitations and disadvantages of the prior art systems and provide desired performance with attendant cost, size and weight advantages so much desired in the cost competitive motion control technology.

SUMMARY OF THE INVENTION

A digital positioning servo system in accordance with the teaching of the present invention represents a truly new and novel design concept that advances the state of the prior art to a level of cost effectiveness and accuracy not attainable and achievable before with prior art positioning systems.

The inherent disadvantages and limitations of the prior art systems where the final positioning of the encoder disc is achieved by using a lock on edge type control method is eliminated in the present invention by an inventive new technique of defining and achieving final positioning in terms of at least two stable logic levels. This technique decisively eliminates all the ambiguities relation to the definition of final inposition state of the encoder disk at any given count. This is a significant advancement in terms of superior performance over a lock on edge type system which does not have well defined dwell to clearly indicate a stable inposition state of the encoder disk at a selected predefined count.

Another disadvantage, inherent with the lock on edge type of system is the fact that even if the required resolution for any given application may not be very high, however, to achieve a higher positioning accuracy, a much larger number of counts are required. This is necessary because the system oscillates about the final position count and smaller the oscillation or the dither, the higher is the positioning accuracy afforded by the system. This detrimentally adds to the size, weight and cost of the system. By employing a superior new design concept in accordance with the teaching of the present invention, which uses two sensors to generate two stable logic states to defines the final positioning at any count, the need for any type of continuous oscillations is totally eliminated. The number of counts required to achieve higher accuracy are also just enough to satisfy resolution requirements and thus offers highest possible accuracy allowed by the system parameters at a smaller cost.

Another significant advantage offered by the new design concept is that only one element is required per count or a graduation on the encoder disk. In the prior art quadrature type systems, two separate elements one for each sensor is required for each count on the encoder disk. This of course, occupies almost twice the circumferential length on a circular disc, and especially for a linear encoder this becomes a very critical consideration because there is no diameter that can be increased to accommodate more counts. Because of only one element that is required per count a significantly greater reduction in size, weight, and cost is realized by the use of the present invention. Also greatly reduced is the manufacturing rejection resulting because of the smaller number of elements to be built on the encoders.

It is one of the primary objects of the present invention to develop a precise digital positioning system without employing any analog components and where the positioning accuracy is deterministic and the error approaches "0" value providing a very high positioning accuracy.

It is an additional object of the present invention to accommodate more resolution and larger number of counts in a given diameter of encoder disc thereby significantly reducing the size, weight, and cost of the entire system.

It is also one more objective of the present invention to offer a design concept where testability of the system is greatly enhanced.

DETAILED DESCRIPTION OF THE INVENTION

Figure 1:
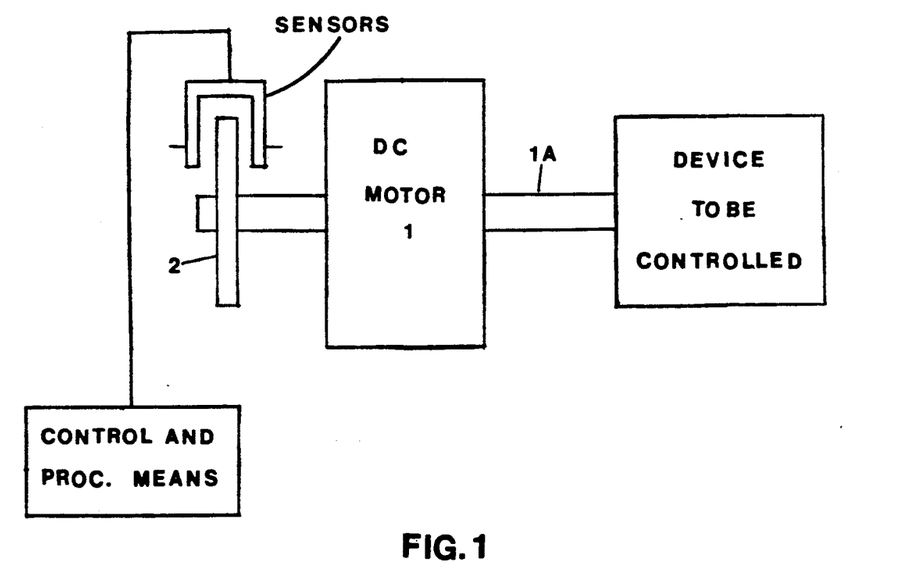
FIG. 1 shows in general layout the interrelation between the various components of a zero error digital positioning system.

The digital positioning system described herein for high precision motion control applications comprises a DC motor 1 with suitable shaft extension at both the ends to implement desired shaft function as shown in FIG. 1. At one end of the motor shaft extension is mounted an encoder disc 2 which rotates with the motor shaft and communicates with the control and processing logic by means of suitable sensors. While the other end provides motion control to the device which requires precise control of the position and other operating parameters.

Modern design methodology relating to rotating and linear encoder and digital positioning control circuit design is very well known and understood in the prior art technology. Many excellent books and literature exist on the design of the digital positioning system utilizing quadrature type encoders. Therefore, no attempt will be made to teach the principles of most efficient sensor design, advanced detection methods and other related logic design techniques which are related and applicable to the present invention.

Primarily, three main species of positioning encoder discs are claimed in the present invention. The digital positioning system described and illustrated in detail will be relating to the encoder disc 2 wherein each count is represented by one area element as shown in FIGS. 2 and 2A and detected by at least two stationary sensors.

Figure 2:
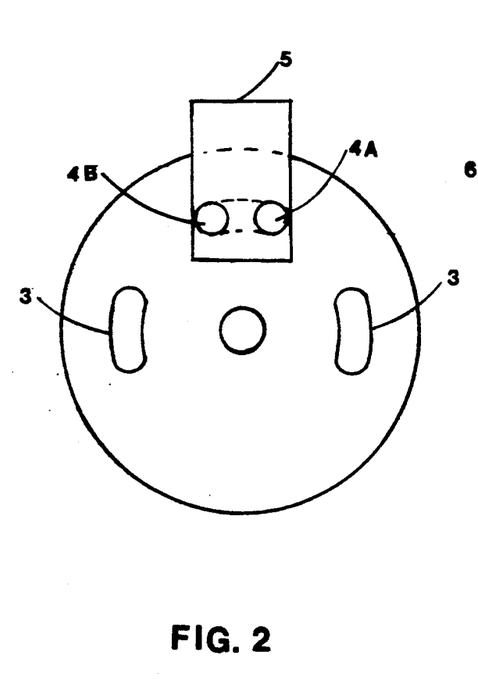
FIGS. 2 and 2A shows layout of the sensor assembly.
Figure 2A:
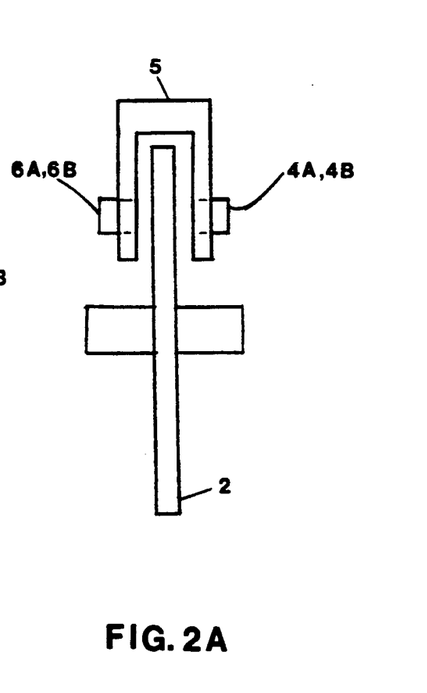

Transparent glass encoder disc 2, as shown in FIGS. 2 and 2A consisting of opaque position elements 3 located circumferentially around the disc forms the structure of position indicating elements defining the angular position of each area element 3. The total number of position elements 3 located on a disc 2 determines the resolution of the encoder disc 2. The encoder disc 2 is mounted on the motor shaft 1A and rotates with the motor shaft 1A. The encoder disc 2 moves through the total number of position elements 3 or counts located on the disc 2 per every revolution. At least two stationary phototransistors 4A, 4B, mounted on suitable brackets 5, are located on one side of the encoder disc 2. Axially on the other side of the encoder disc are located at least two light sources 6A, 6B, one for each phototransistor 4A and 4B. Each phototransistor 4A and 4B is aligned with the light source 6A, 6B, by which it will be activated. The two phototransistors 4A, 4B, are circumferentially separated equal to the distance of circumfrencial length of each position or count 3 in such a manner that the movement of the disc 2 out of the inposition state will be immediately detected by the two phototransistors 4A and 4B. An encoder housing (not shown) is provided to house the disc 2 and the sensors 4A, 4B. The housing, disc 2, and sensors 4A and 4B can be packaged as an independent unit which couples with the motor. Other packaging option includes the disc and the other components of the system made as an integral part of the motor itself as one unit.

The glass encoder disc 2, is said to be aligned or termed in position at any selected count, when the opaque element defining the position of that position element blocks the light source from activating the two phototransistors 4A and 4B and thereby driving each sensor to "LOGIC 1" state. A slight detectable movement of the encoder disc 2, in clockwise direction will drive the left sensor 4B to "LOGIC 0" state, leaving the right sensor 4A unchanged at "LOGIC 1" state. In a similar manner, for anticlockwise movement, right sensor 4A will change logic state, leaving the logic state of the left sensor 4B unchanged. The encoder disc 2 is said to have incremented by one count in any selected direction when the encoder disc 2 has moved in the given direction and the sensors are aligned with the adjacent count. Likewise, the encoder disc is decremented by one count, when the encoder disc 2 is aligned with the adjacent count in the opposite direction.

Figure 3:
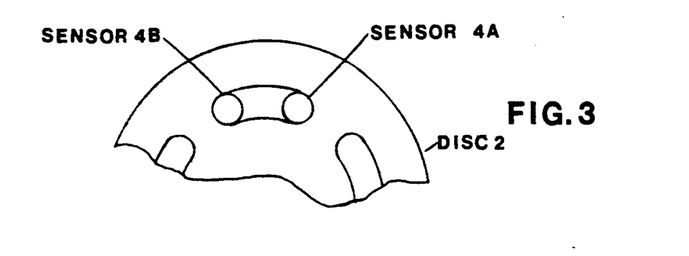
FIG. 3 shows the sensor and disc positions for the inposition state of the encoder disc.

FIG. 3 shows the encoder disc 2 at inposition at a selected count.

Figure 4:
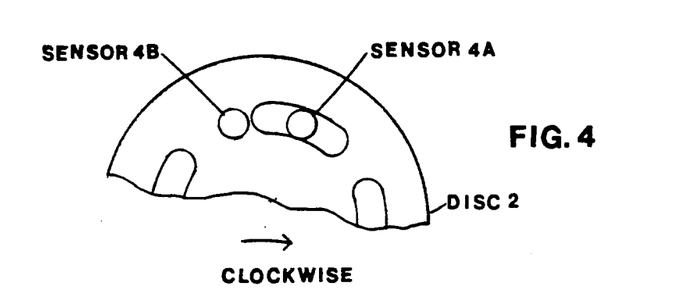
FIG. 4 shows the sensor positions for the clockwise rotation of the encoder disc

FIG. 4 shows movement in clockwise direction.

Figure 5:
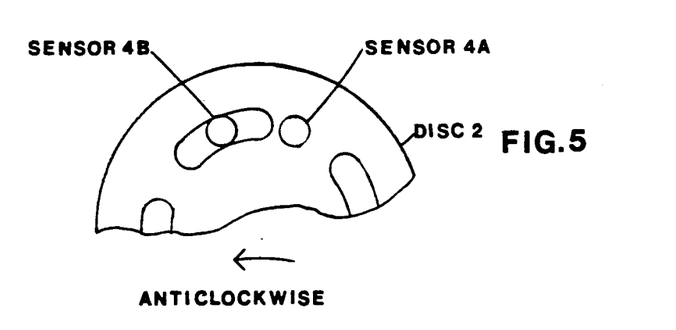
FIG. 5 shows the sensor positions for the anticlockwise rotation of the encoder disc

FIG. 5 shows movement in anticlockwise direction.

To achieve the position change of the encoder disc from a present count to a predefined final count, the encoder disc is moved in a selected direction by applying the voltage of correct DC polarity to the DC motor. As the disc is rotated towards the final count by the DC motor, the movement through each position element or the count is counted by the counter and at the end of the desired number of counts, the disc is stopped by switching off the power to the DC motor. After reaching the final count, the disc is maintained in position or "locked" at the final count by constantly correcting the error by switching the DC motor in the desired direction and the true position of the disk at the final count is then achieved by maintaining the position error at a zero value.

Figure 6:
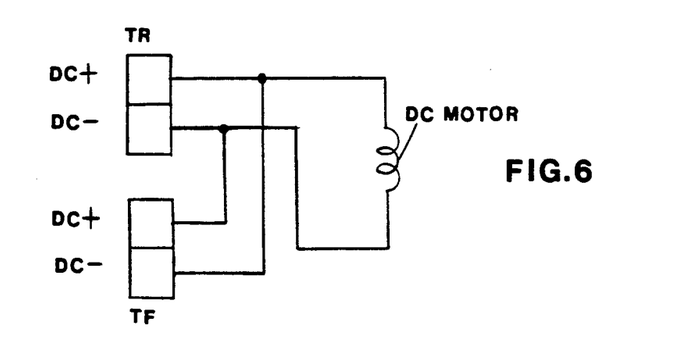
FIG. 6 shows the DC motor connection to the driving transistors.
Figures 10, 11:
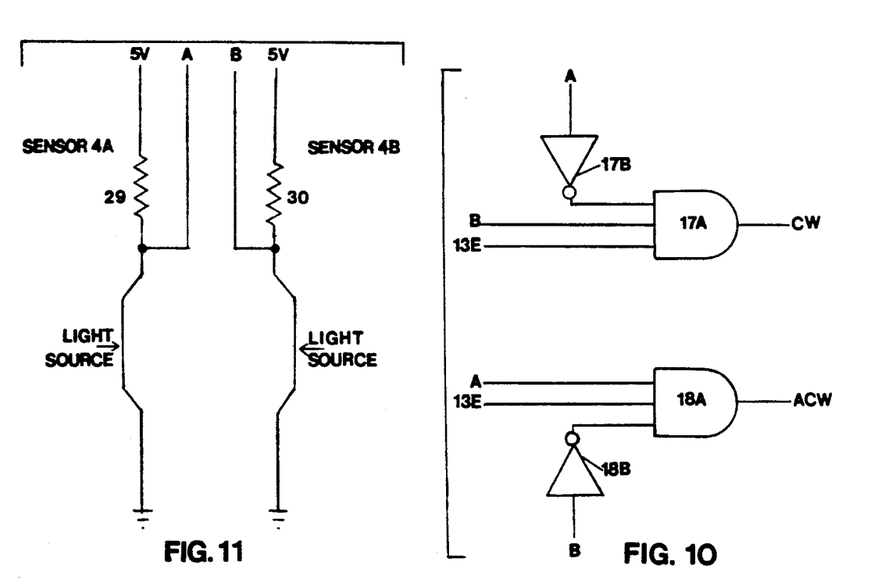
FIG. 10 shows a combination digital logic circuit employing various logic gates to control the encoder disc in the terminal phase of the final positioning.
FIG. 11 shows a scheme to generate the required logic state outputs from the sensors.

Two pairs of power transistors drives the DC motor in opposite direction to achieve desired direction of rotation and motion control as shown in FIG. 6. One pair drives the DC motor in clockwise direction where the other pair drives the motor in the anticlockwise direction. A pair of power transistors TF energizes motor in clockwise direction while a pair of power transistors TR drives the motor in anticlockwise direction as shown in FIG. 6. A control and processing means controls the switching of the power transistors TF and TR lo implement and execute proper control sequence of DC motor to accurately position the encoder disk at the desired count. FIG. 11 shows connection of sensors such as phototransistors to logic power source at logic voltage to generate logic state outputs. This scheme will generate "LOGIC 1" output when the light source is inhibited from activating the phototransistor and generate "LOGIC 0" when the light source allowed to activate the phototransistor in to a conducting. "A" represents the logic output of sensor 4A while "B" represents the logic output of sensor 4B.

The digital control circuit in the control and processing means comprises of various digital logic elements such as AND, OR and NAND logic gates, flip flops, inverters, comparators and counters. The output voltage generated by the sensors, representing the logic state output of the sensors is used as logic input to the digital control circuit. And, the digital control circuit in response to the sensor inputs, generates switching signals to control the power transistors TF and TR. The power transistors TR and TF, as explained earlier, then accurately controls the DC motor operating parameters to achieve required positioning of the encoder disc 2.

Figure 7:
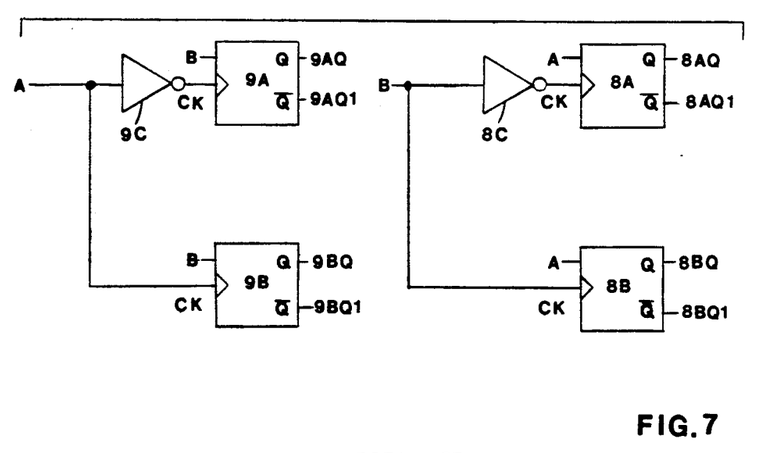
FIG. 7 shows the scheme to determine the direction of the encoder disc in terms of the stored logic states of the sensors.

In order to accurately implement the desired control functions to achieve desired position control it is very important to determine the instantaneous position of the count element with reference to the sensors at any given time. It is also equally important lo detect the movement of the encoder disc in any direction as soon as it occurs. The logic scheme as shown in FIG. 7, allows the output status of each sensor to be noted and stored when the output logic state of one sensor changes to an opposite direction due to the movement of the encoder disc and therefore of the position element or count. This technique will enable the control logic to implement the desired functions with high degree of accuracy.

As shown in FIG. 7, for the clockwise rotation of the encoder disc, flip flop (FF) 8A stores the output logic state of sensor 4A, when 4B changes logic state from "LOGIC 1 to LOGIC 0". This is done by connecting clock of FF 8A to sensor 4B through an inverter 8C and the input of FF 8A to sensor 4A. In a similar manner, for the clockwise rotation of the encoder disk, FF 8B stores the output status of sensor 4B when 4A changes logic state from "LOGIC 0 to LOGIC 1".

When the encoder disc rotates in an anticlockwise direction, the output logic state of the sensor 4B is stored when the sensor 4A changes the logic state. flip flop (FF) 9A stores the output logic state of sensor 4B when 4A changes logic state from "LOGIC 1 to LOGIC 0". This is done by connecting clock of FF 9A to sensor 4A through an inverter 9C and the input of FF 9A to sensor 4B. In a similar manner, for the anticlockwise rotation of the encoder disk, FF 9B stores the output status of sensor 4B when 4A changes logic state from "LOGIC 0 to LOGIC 1". In the description and illustration of the FF outputs, the Q output of each FF will be designated by Q and the complementary output of each FF will be designated by Q1.

FF 8A stores status of sensor 4A when 4B changes logic state from "LOGIC 1 to LOGIC 0".

It will be observed by the reader that for anticlockwise operation the function of FF 8A and 8B are performed by FF 9A and 9B.

Circuits shown and illustrated in FIG. 7-11 shows digital control scheme designed to accurately position the encoder disc at a predetermined position element accurately defined by an area element. To explain and illustrate the operation of the zero error control scheme in accordance with the teaching of the present invention, certain assumptions will be made.

1. Digital control scheme for a selected position element for anticlockwise operation will be described in detail.
2. The disc is in the position at the present count.
3. The encoder disc is commanded by and appropriate signal to change the position to the selected final count.

As an illustration, to initiate the operation, if the DC motor is energized in the clockwise direction by TF, an increment in first count is implemented when the following sequence of events occur as shown and illustrated in FIG. 7. When the sensor 4B changes from "DARK TO LIGHT" it generates a logic state change from "LOGIC 0" to LOGIC 1" through INVERTER 8C. This logic state change will clock the "LOGIC 1" output of the sensor 4A to Q of FF 8 thereby driving Q of FF to "LOGIC 1". Next, when the sensor 4A changes from "DARK TO LIGHT", it generates a logic state change from "LOGIC 0" to LOGIC 1" through INVERTER 9C. This logic state change will clock the "LOGIC 0" output of the sensor 4B to FF 9A thereby driving Q1 of FF 9A to "LOGIC 1". In the next phase, when the sensor 4B changes from "LIGHT TO DARK" it generates a logic state change from "LOGIC 0" to LOGIC 1". This logic state change will clock the "LOGIC 0" output of the sensor 4A to FF 8B thereby driving Q1 of FF 8B to "LOGIC 1". Finally, when the sensor 4A changes from "LIGHT TO DARK", it generates a logic state change from "LOGIC 0" to LOGIC 1". This logic state change will clock the "LOGIC 1" output of the sensor 4B to FF 9B thereby driving Q of FF 9B to "LOGIC 1". Thus, when the output of FF 9A and 8B are at "LOGIC 0" and the Q output of FF 8A and 9B are at "LOGIC 1" and simultaneously, the outputs of both the sensors being maintained at "LOGIC 1" state, a change in count is registered in the clockwise direction. It will be observed that this unique combination of output logic states generated by the above referenced devices will only exist when the encoder disc moves from one count to the next in the clockwise direction. It is this unique combination of logic states generated by the above referenced devices that will be used to register and record the number of counts through which the encoder disc will move.

When the DC motor is energized in the anticlockwise direction, by energizing TR, an increment in first count is implemented when the following sequence of events occur. When the sensor 4A changes from "DARK TO LIGHT" it generates a logic state change from "LOGIC 0" to LOGIC 1" through INVERTER 9C. This logic state change will clock the "LOGIC 1" output of the sensor 4B to Q of FF 9A thereby driving Q of FF 9A to "LOGIC 1". Next, when the sensor 48 changes from "DARK TO LIGHT", it generates a logic state change from "LOGIC 0" to LOGIC 1" through INVERTER 9C. This logic state change will clock the "LOGIC 0" output of the sensor 4A to FF 8A thereby driving Q1 of FF 8A to "LOGIC 1". In the next phase, when the sensor 4A changes from "LIGHT TO DARK" it generates a logic state change from "LOGIC 0" to LOGIC 1". This logic state change will clock the "LOGIC 0" output of the sensor 4B to FF 9B thereby driving Q1 of FF 9B to "LOGIC 1". Finally, when the sensor 4B changes from "LIGHT TO DARK", it generates a logic state change from "LOGIC 0" to LOGIC 1". This logic state change will clock the "LOGIC 1" output of the sensor 4A to FF 8B thereby driving Q of FF 8B to "LOGIC 1". Thus, when the Q outputs of FF 9A and 8B are at "LOGIC 1" and the Q1 output of FF 8A and 9B are at "LOGIC 1" and simultaneously, the outputs of both the sensors being maintained at "LOGIC 1" state, a change in count is registered in the anticlockwise direction.

It will be observed that this unique combination of output logic states generated by the above referenced devices will only exist when the encoder disc moves from one count to the next in the anticlockwise direction. It is this unique combination of logic states generated by the above referenced devices that will be used to register and record the number of counts through which the encoder disc will move.

A very unique feature of the above referenced counting logic is that if the encoder disc moves in either direction after reaching the in position status, and returns to the same count, the unique combination of output logic states generated by the above referenced devices will not remain the same and therefore, the same count will not be registered more than once. A repeat number of counts is registered in a similar manner by a counting device with each count generating the required logic state for either direction of rotation as explained earlier.

Figure 8:
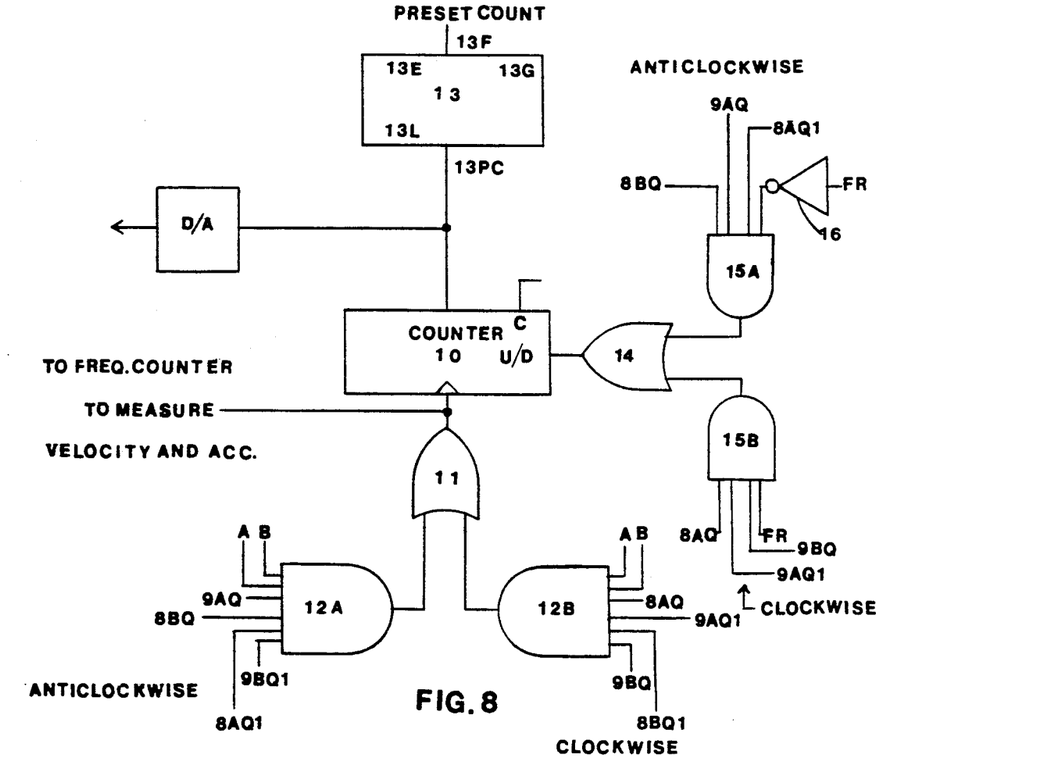
FIG. 8 shows a combination digital logic circuit employing a counter, comparator and various logic gates to count the number of counts through which the encoder disc moves.

A digital counter 10, as shown in FIG. 8 is used to count the number of counts through which an encoder disc 2 moves to reach the final count. As it moves towards the final count, it generates required combination of unique output logic states controlled by the sensors and various logic devices as stated and explained earlier in the description.

logic device 10 is an up/down counter. This counter is clocked by an OR gate 11 and the input to OR gate 11 is generated by two AND gates 12A and 12B for either direction of rotation. AND gate 12A generates "LOGIC 1" output by inputs 9AQ, 8BQ, 8AQ1, 9BQ1, and sensor inputs 4A and 4B. In a similar manner, AND gate 12B generates "LOGIC 1" output by inputs 9AQ1, 8AQ, 8BQ1, 9BQ, and sensor inputs 4A and 4B. A "LOGIC 1" output generated by either gates 12A or 12B will generate a "LOGIC 1" at the output of OR gate 11, thereby clocking the counter to change the count by one in either mode of count for either direction of rotation of the encoder disc.

It is important for the control logic to keep track of the status of the counter by comparing the counter to a reference count, and thus enable the control logic to generate required DC motor voltage in terms of magnitude and direction to enable the encoder disc to reach the final count in a minimum time with high accuracy. This function of comparison is performed by a digital comparator device. A comparator device 13, also shown in FIG. 8, comprises two inputs. One input, 13FC, is the number of counts through which the encoder disc has to increment to move to reach the final count and the second input, 13PC, is the present count through which the encoder disc has moved from the initial position. The comparator device, 13, compares the present count of the counter 10, which indicates the number of counts through which the encoder disc 2, has moved from the initial position, with the final count 13FC to be reached by the counter to achieve final position. Based on this comparison information, some status signals are generated by the comparator device 13, such as, 13E, equal to and 13G, 13L, greater than and less than the two values being compared. logic levels representing the current comparison status of the encoder disc position count is used in achieving the terminal positioning of the encoder disc.

Once the counter reaches the final count, due to the finite inertia of the positioning system, the encoder disc will rotate past the final count in either direction after the power is switched off. If the final positioning is to be accurately maintained, a fine positioning control logic is required in the terminal phase of the final positioning. The terminal positioning is achieved and controlled by gates 17A, 18A and inverters 17B and 18B as shown in FIG. 10. If the disc is offset on the clockwise side, an anticlockwise rotation to final position is generated by gate 17A and inverter 17B till both the sensors 4A and 4B are driven to "LOGIC 1" state. In a similar manner, the offset on the anticlockwise direction is corrected by gate 18A and inverter 18B by generating a clockwise movement of the encoder disc to the final position.

Figure 9:
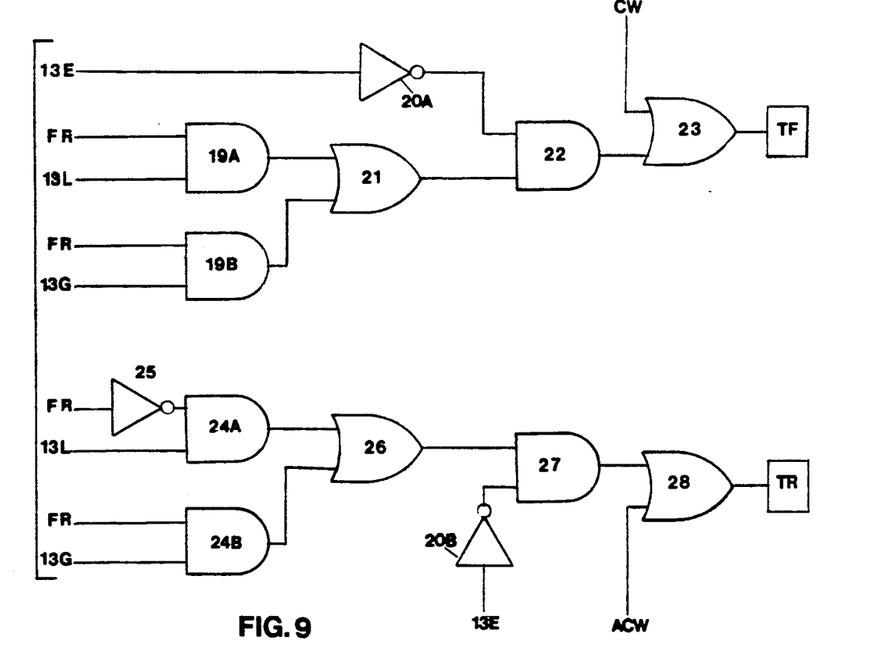
FIG. 9 shows a combination digital logic circuit employing various logic gates and power transistors to dynamically control the movement of the encoder disc to final position.

Desired direction of rotation can be selected by selecting the logic state on the direction of rotation control signal as shown in FIG. 9. When a "LOGIC 1" signal state is present on the direction of rotation (FR) signal line, it represents desired rotation of the encoder disc in the clockwise direction. While a "LOGIC 0" state on the FR signal line represents desired rotation in the anticlockwise direction. The comparator device 13, generates status control signals which indicates if the number of counts moved by the encoder disc from the initial position to the present count position is less than equal to or greater than the desired final count the encoder disc will finally stop at.

Output status Control signal 13L indicates if the present count on the counter 13 is less than equal to or greater than the final count status of the counter before the final count is reached by the encoder disc, "LOGIC 1" on the output 13L indicates that the comparator has compared the present count on the counter with the final count the counter is required to reach and that the counter has not yet reached the final count status. "LOGIC 0" on 13L represents a count status which indicates that the present count on the counter is equal to or greater than the final count status the counter is required to reach.

Control signal 13G represents that the present count on the counter is greater than the final count status of the counter before the final count is reached . "LOGIC 1" on the 13G represents that the comparator has compared the present count on the counter with the final count the counter is required to reach and that the counter has not reached the final count status. "LOGIC 0" on 13G represents a count status which indicates that the present count on the counter is equal to or less than the final count status the counter is required to reach.

Output status control signal 13E represents equal to status of the counter to the final count. "LOGIC 1" on 13E represents that the counter has reached the final count. "LOGIC 0" on 13E represents that the present count is not equal to the final count.

To start the digital positioning system in accordance with the teaching of the present invention, first the counter 10, is cleared and control logic comprising of input AND gates 19A, 19B, 24A and 24B starts the rotation of the encoder disc 2, towards the final count as shown in FIG. 9. If the encoder disc rotates past the final count as would normally happen, the control logic reverses the direction of rotation of the encoder disc and brings it back to the final count. A pair of transistors TF energizes motor in clockwise direction while a pair of TR drives the motor in anticlockwise direction. Consider the desired direction of rotation is in the clockwise direction. The control logic comprising of gates 19A, 19B, 21, 22, and 23 drives the DC motor in the clockwise direction to the final count by switching TF in to conduction. At this point the equal to signal 13E, through INVERTER 20A, transfers the terminal position control to gates 17A and 17B to eliminate offset and to achieve zero error value. If the disc 2, rotates too far, past the final count in the clockwise direction, AND gate 24B reverses the direction by switching TR in to conduction until the encoder disc comes back to the present count.

As has been assumed earlier for the purposes of description and illustration, if the desired rotation is in the anticlockwise direction, AND gate 24A, INVERTER 25, OR gate 26, AND gate 27, and final output OR gate 28 will generate switching signal to drive TR in to conduction as shown in FIG. 9, till the encoder disc 2 either reaches the final count or rotates past the final count. If the final count is reached by the disc, the terminal offset control is transferred to AND gate 17A and 18A. If the encoder disc rotates past the final count, AND gate 19B reverses the direction of the rotation by turning TF in to conduction until the disc 2, reaches the final count, where the terminal control is transferred to terminal offset control logic handled by AND gates 17A and 17B.

The counter 10, maintains the status of the number of counts through which the encoder disc has actually moved by counting in a up or down mode as shown in FIG. 8. The up or down mode on the counter is selected, depending on the encoder disc either moving in forward or in the reverse direction with reference to the selected direction of rotation. "LOGIC 1" on the up/down control input forces the counter to count in the up mode. A "LOGIC 0" on the up/down control input forces the counter to count in the down mode. For a desired rotation of the encoder disc in the clockwise direction, the increment in count will be registered with counter counting in up mode when the encoder disc rotates in the clockwise direction. The decrement in count will be registered when the encoder disc rotates in anticlockwise direction with the counter counting in the down mode. The order of up/down function is reversed when the selected or desired rotation is in the anticlockwise rotation.

The up/down count control input function on the counter is achieved by combining the direction of rotation signal FR and the output of FFs 8A, 8B, 9A and 9B as shown in FIG. 8. The OR gate 14 controls the up/down function on the counter 10. When the FR signal is at "LOGIC 1", the desired rotation is in the clockwise direction. This requires that the counter count in up mode when the encoder disc rotates in the clockwise direction and the counter count in the down mode when the encoder disc rotates in the anticlockwise direction. The AND gate 15B will generate "LOGIC 1" when the encoder disc rotates in the clockwise direction and generate "LOGIC 0" when rotating in the anticlockwise direction as shown in figure. When the encoder disc rotates in the clockwise direction, the FF outputs 8AQ, 9AQ1, and 9BQ, acting as inputs to AND gate 15B will be stored at "LOGIC 1" as explained earlier in the description. And with the FR signal at "LOGIC 1", the AND gate 15B and the OR gate 14 will output "LOGIC 1" to the counter up/down control input, forcing the counter to count in the up mode for the clockwise rotation of the encoder disc as shown in figure. When the encoder disc rotates in the anticlockwise direction with the FR signal still at "LOGIC 1", however, the FF outputs 8AQ, 9AQ1, and 9BQ, acting as inputs to AND gate 15B will not be stored at "LOGIC 1", as explained earlier in the description. Thus forcing the AND gate to output "LOGIC 0" to the up/down control on the counter and forcing the counter to count in the down mode when the encoder disc rotates in the anticlockwise direction.

When the FR signal is at "LOGIC 0", the desired rotation is in the anticlockwise direction. This requires that the counter count in up mode when the encoder disc rotates in the anticlockwise direction and the counter count in the down mode when the encoder disc rotates in the clockwise direction. The AND gate 15A will generate "LOGIC 1" when the encoder disc rotates in the anticlockwise direction and generate "LOGIC 0" when rotating in the clockwise direction as shown in figure. When the encoder disc rotates in the anticlockwise direction, the FF outputs 8BQ, 8AQ1, and 9AQ, acting as inputs to AND gate 15A will be stored at "LOGIC 1", as explained earlier in the description. And with the FR signal at "LOGIC 0", the INVERTER 16, the AND gate 15A and the OR gate 14 will output "LOGIC 1" to the counter up/down control input, forcing the counter to count in the up mode for the anticlockwise rotation of the encoder disc as shown in FIG. 8. When the encoder disc rotates in the clockwise direction with the FR signal still at "LOGIC 0", however, the FF outputs 8BQ, 8AQ1, and 9AQ, acting as inputs to AND gate 15A will not be stored at "LOGIC 1", as explained earlier in the description. Thus forcing the AND gate 15A to output "LOGIC 0" to the up/down control on the counter and forcing the counter to counting the down mode when the encoder disc rotated in the clockwise direction.

Pull up resistors 29 and 30 are used to generate logic state outputs from the sensors 4A and 4B.

A digital to analog converter (D/A) converter as shown in FIG. 8, provides a signal of appropriate magnitude which is proportional to the number of counts the encoder disc has to move to reach the final count. This analog control signal is translated in terms of voltage applied to the DC motor. The voltage magnitude will be higher for larger number of counts which will be required lo reach the final count and the voltage magnitude will be smaller for a smaller number of counts required to reach the final count from the present count. This allows precise control of velocity and acceleration of the positioning system.

As the encoder disc 2, rotates in either direction, the sensors are activated and deactivated by the count elements. In the embodiment described earlier, the increment in count is measured from one count to the next count. It is, however, also possible to measure movement of half a count, because the sensors detects the space between the two counts as the disc moves. When the counts are equally spaced around the encoder disc, the position detecting FF's can be used to detect half the angle or linear distance for a linear encoder between the two counts. If half a count is used as a measure of one count, the number of counts can be doubled for the same diameter of the disc making possible large savings in size, weight, and cost of the disc.

Figure 12:
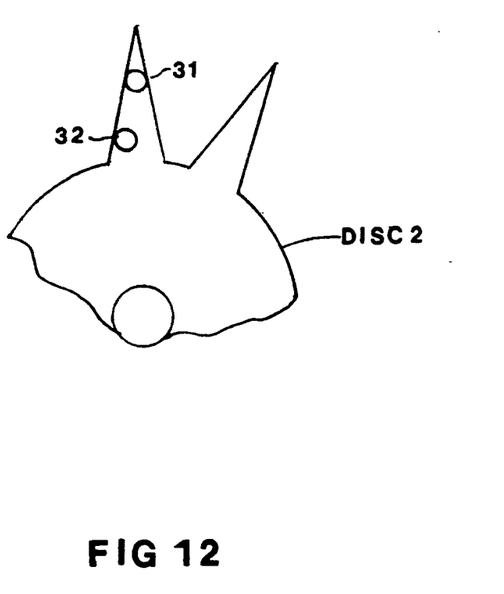
FIG. 12 and 13 shows two additional embodiments of the encoder disc.
Figure 13:
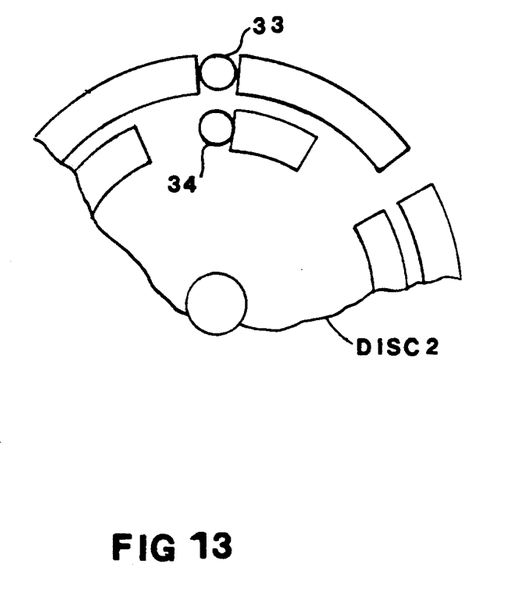

FIGS. 12 and 13 shows two more embodiments of the encoder which will provide zero error positioning.

As shown in FIG. 12, the encoder in this embodiment has two sensors detecting the position of the count element. The sensor 31 detects a point element and 32 detects area element. For rotation in one direction, the point element sensor 31 changes logic state and along with it the area element sensor 32 changes the logic state also. For rotation in opposite direction, the point element sensor 31 changes logic state and the area element sensor 32 does not changes the logic state.

As shown in FIG. 13, the encoder in this embodiment has two sensors detecting the position of the count element. The sensor 33 detects a point element and 34 detects area elements of different lengths. For rotation in one direction, the point element sensor 33 changes logic state and along with it the area element sensor 34 changes the logic state also. For rotation in opposite direction, the point element sensor 33 changes logic state and the area element sensor 34 does not changes the logic state and the sensor 34 detects the area elements of different lengths.

Those skilled in the art will recognize the fact that the control scheme and the digital logic described above can be modified in different ways to achieve the same result. The basic concept in the design of control and processing circuit is that thee inposition signal is generated by at least two logic levels and movement from any inposition state to the next count is detected by storing the logic states of aH sensors when one sensor changes a logic state and combining the stored logic states with the active logic states of the two sensors.

A rotary positioning system in accordance with the teaching of the present invention has been described and illustrated earlier. A linear positioning system, based on the same control logic can be designed to achieve the same results for accurate linear positioning of the movable linear member. The position elements will be located along the linear path of the movable member instead of the rotary path described for the rotary encoder.

An additional strength of the present invention is that it also lends itself very eminently to microprocessor control wherein the control functions can be implemented in software routines. It is also possible to implement the logic hardware on a mate array integrated circuit.

During the power on sequence, the encoder disc is to be incremented to at least one count. This is necessary because when the counter is cleared and ready to count the increment or decrement in the movement of the encoder disc to the next count, it is assumed that the encoder disc is in position at the present count. In actual practice, however, the encoder disc may not always be at the inposition state at any given count when the power is turned on. This will eliminate any positioning error at the final count.

CONCLUSION AND SUMMARY OF ADVANTAGES

The new concept introduced by the present inventor in the design of the digital positioning systems represents a major mile stone in the ongoing development of the servo system technology. The strength and superiority of any new invention over prior art is judged by the advantages it confers to overcome the limitations and disadvantages of the prior art to which it pertains and degree to which it advances the state of the prior art technology. The advantages sought and gained will be in the area of reduction of cost, improvement in performance, decrease in size, weight and the positive impact it makes on the environment.

The present invention successfully achieves above objectives to enrich and further advance the state of art in digital positioning systems. The advantages and the superior performance conferred by the present invention allows the new servo systems to meet the requirements of new, advanced applications not within the performance capabilities of the prior art systems.

The advantages can be finally summarized in the following conclusion.

1. The accuracy of the positioning system in accordance with the teaching of the present invention is greatly enhanced because the system does not oscillate at the final position count. The error value approaches zero and does not change with the load inertia as occurs in the prior art positioning system.

2. The system does not require an additional analog circuit to achieve finer and accurate positioning at the final count.

3. The prior art system requires a larger number of counts to achieve a higher positioning accuracy even if the required resolution does not dictate a larger number of counts. This will increase the cost, size and weight of the system hardware. The present invention eliminates the need for larger counts for higher accuracy, thus, greatly reducing the cost, size and weight of the system hardware.

4. Only one count element is required for each position step to achieve high position accuracy. Prior art system requires two position elements per position step.

5. The cost, size and weight of the system hardware is further reduced when a measurement of half a count is made by the control logic, doubling the resolution of the disc.

6. In the quadrature type positioning system, any misalignment in the encoder shaft or sensors is difficult to detect resulting in phase error in the two independent pulse trains. In the present invention this error is minimized since there are no separate pulse trains to introduce independent errors. The two sensors in the present invention work simultaneously to generate the inposition pulse so that any misalignment which occurs, can be detected easily and immediately. The system can also be designed to allow desired degree of tolerance before the system will indicate error in the positioning.

While only some of the many possible embodiments of the present invention have been described and illustrated, this should not be construed as the limitations on the scope of the invention. Those skilled in the art will recognize the fact that it is possible to make various omissions and substitutions and changes in the details of the zero error digital positioning system without departing from the true spirit of the invention. It is therefore the intention in the appended claims and their legal equivalents to cover all such possible modifications and alterations as may fall within the true spirit and scope of the present invention.

I claim:

1. A zero error digital servo system comprising:
   at least one primary sensor means and a means to activate the same;
   at least one secondary sensor means and a means to activate the same;
   a first member means interposed between the sensor means and the means to activate, so positioned that a free relative motion exists between the first member means and the sensor means;
   a position element means which comprises at least one position element characterized by area elements and point elements located on said first member means so that when said first member means moves, the position elements also move from one position element to the next, this movement is defined as change in one count;
   when said position element is aligned with said primary sensor means and said secondary sensor means, said primary sensor means outputting at least one logic state and said secondary sensor means outputting at least one selected logic state, said first member means is defined to be in an inposition state;
   when the position element moves out of said in-position state, at least one sensor means will change the output logic state to an opposite logic state; and
   a control and processing means which includes:
      a means to store output logic state of each sensor means when one sensor means changes logic state;
      a means to combine selected stored output logic states with a current output logic state of at least one sensor means to generate a first output logic state combination;
      a counting means for counting the number of repeat occurrences of the first output logic state combination;
      a means to compare the repeat occurrences of said first output logic state combination with a preselected number of first logic state combination; and
      said first member means is moved till the repeat occurrences of said first output logic state combination reaches said preselected number of first logic state combination, said first member means is maintained at the final occurrence of the first output logic state combination by continuously correcting the position of the first member means.

2. A servo system of claim 1 in which: p1 said position element means comprises a plurality of position elements wherein each of said position element includes the point element and the area element, the sensor means communicating with the point element will be the primary sensor means and the sensor means communicating with the area element will be the secondary sensor means;

the position element is in the in-position state, at a count being selected, when the primary sensor means outputs at least one selected logic state and the secondary sensor means outputs one more selected logic state determined by the output configuration of the two sensor means; and movement of said position element means out of the inposition state in one direction is defined when said primary sensor means changes logic state while said secondary sensor means does not change logic state, and movement in the opposite direction is defined when said primary sensor means and said secondary sensor means both change logic state.

3. A servo system of claim 1 in which:

said first member means comprises transparent medium, each said position element comprises opaque medium, wherein said position element is arranged in a triangular shape so that the apex of the triangular shape forms the point element and the lower part forms the area element, the sensor means communicating with the point element will be the primary sensor means and the sensor means communicating with the area element will be the secondary sensor means;

the two sensor means comprises an output configuration which includes a circuit whereby each sensor means will output a "LOGIC 1" when aligned with the position element means, and each sensor means will output a "LOGIC 0" when aligned with the transparent medium, and the position element means is in the in-position state, at a count being selected, when the primary sensor means outputs at least one "LOGIC 1" state, and the secondary sensor means outputs another "LOGIC 1" state; and movement out of the in-position state in one direction is defined when said primary sensor means changes logic state to "LOGIC 0" while said secondary sensor means does not change logic state and movement in the opposite direction is defined when said primary sensor means and said secondary sensor means both changes logic state to "LOGIC 0".

4. A servo system of claim 1 in which:

said position element means includes a plurality of position elements wherein each position element comprises the area element wherein the primary sensor means and the secondary sensor means both communicate with said area element;

a selected position element is in the in-position state, at a count being selected, while the primary sensor means outputs a selected logic state and the secondary sensor means outputs at least one selected logic state determined by the output configuration of the two sensor means; and movement out of the in-position state in one direction is defined when said primary sensor means changes logic state while said secondary sensor means does not change logic state, movement in the opposite direction is defined when said primary sensor means does not change logic state while said secondary sensor means changes logic state.

5. A servo system of claim 1 in which:

said first member means comprises transparent medium, each said position element comprises opaque medium, wherein said position element includes the area element of width equal to the spacing between the two sensor means and the area element communicates with the primary sensor means and the secondary sensor means;

the two sensor means comprises an output configuration which includes a circuit whereby the sensor means outputs a "LOGIC 1" when aligned with the position element and outputs a "LOGIC 0" when aligned with the transparent medium, and a selected position element is in the in-position state, at a count being selected, when the primary sensor means outputs a "LOGIC 1" state and the secondary sensor means outputs at least one "LOGIC 1" state; and movement out of the in-position state in one direction is defined when said primary sensor means changes state to "LOGIC 0", while said secondary sensor means does not change logic state, movement in the opposite direction is defined when said primary sensor means does not change logic state while said secondary sensor means changes state to "LOGIC 0".

6. A servo system of claim 1 in which:

said position element means includes a plurality of position elements wherein each position element comprises the area element, the primary sensor means and the secondary sensor means both communicate with said area element;

a selected position element is in the in-position state, at a count being selected, when the primary sensor means outputs a selected logic state and the secondary sensor means outputs at least one selected logic state determined by the output configuration of the two sensor means;

movement out of the in-position state in one direction is defined when said primary sensor means changes logic state while said secondary sensor means does not change logic state, movement in the opposite direction is defined while said primary sensor means does not change logic state when said secondary sensor means changes logic state; and said position elements are positioned on the first member means in a manner that the spacing between each position element is equal to the width of the area element or the spacing between the two sensor means which will allow the spacing between the two position elements to be measured as half of a count by appropriate logic state on the primary sensor means and the secondary sensor means and thereby double the resolution of the first member means.

7. A servo system of claim 1 in which:

said position element means comprises a plurality of position elements wherein each position element includes the point element and the area element, and the sensor means communicating with the point element will be the primary sensor means and the sensor means communicating with the area element will be the secondary sensor means, wherein by selecting the width of the area element, it is possible to determine the percentage of movement of the first member means between any two position elements;

said position element means is in the in-position state, at a count being selected, when the primary sensor means outputs a logic state and the secondary sensor means outputs a selected logic state determined by the output configuration of the two sensor means, and by detecting the logic state of the area element at all the time, the position of the first member means between the two position elements as a percentage of total movement can be detected by the two sensor means; and movement out of the in-position state in one direction is defined when said primary sensor means changes logic state, while said secondary sensor means does not change logic state and movement in the opposite direction is defined when said primary sensor means changes logic state, said secondary sensor means also changes logic state.

8. A servo system of claim 1 wherein the velocity of said first member means is measured by measuring the frequency of said counting means.

9. A servo system of claim 8 wherein a signal proportional to the number of repeat occurrences necessary to reach the preselected number of first logic state combination is generated for controlling the velocity of the first member means.

10. A servo system of claim 1 wherein:

said means to store includes a plurality of flip flops able to store output logic state of each sensor means when one sensor means changes logic state;

said counting means comprises a counter which includes a clock input, count outputs, and up/down control input;

said means to compare includes a comparator which compares two count numbers presented at the comparator input;

said control and processing means further comprises:

a first combination logic circuit to generate the first output logic state combination, includes at least one gate performing an equivalent OR function having as input at least two signals each representing movement of the first member means in one direction and further includes a plurality of gates performing equivalent AND function;

a second combination logic circuit providing input to the counter up/down control which includes at least one gate performing an equivalent OR function having as input at least two signals generated by a plurality of gates performing an equivalent AND function;

a third combination logic circuit providing control input to DC motor control transistors to actuate a DC motor, wherein said DC motor controls the movement of said first member means;

said third combination logic circuit further includes a plurality of AND and OR gates, and inverters; wherein the increment in count is registered in the counter when the means to store stores logic state of the sensor means, defining the movement of the first member means from one count to the next, and generating a clock signal at the counter clock input using the first combination logic circuit, the count value is compared with a reference count on the comparator, and the first member means is moved by the DC motor till the first member means has moved through the desired number of counts indicated by the reference count and wherein the direction of rotation is maintained by the second combination logic circuit providing up/down control to the counter.

11. A servo system of claim 10 further includes a terminal position control circuit which controls the first member means in final phase at least two AND gates and two inverters whereby an offset from a true in-position state of the first member means is corrected by outputting a control signal to an appropriate DC motor transistor by generating a signal which determines the direction of offset by comparing the logic states of the two sensor means, and this signal in turn controls the first member means in the opposite direction of the offset.

* * * * *